United States Patent [19]
Patel et al.

[11] 4,389,713
[45] Jun. 21, 1983

[54] DUAL PULSE METHOD OF WRITING AMORPHOUS MEMORY DEVICES

[75] Inventors: Vipin N. Patel, Melbourne; Joseph S. Raby, West Melbourne, both of Fla.

[73] Assignee: Harris Corporation, Melbourne, Fla.

[21] Appl. No.: 272,314

[22] Filed: Jun. 10, 1981

[51] Int. Cl.³ .................... G11C 11/00; H01L 45/00
[52] U.S. Cl. ..................................... 365/163; 357/2
[58] Field of Search .......................... 365/163; 357/2

[56] References Cited
U.S. PATENT DOCUMENTS
3,827,033  7/1974  Quilliam ........................... 365/163

Primary Examiner—George G. Stellar
Attorney, Agent, or Firm—Leitner, Palan, Martin & Bernstein

[57] ABSTRACT

A first voltage pulse is applied having sufficient amplitude to switch the device from a high to a low resistance state and subsequently maintaining a holding current. A second voltage pulse is applied after the device has switched to drive the filamentous path into the liquid phase for a short duration.

10 Claims, 20 Drawing Figures

A

B

C

D

E

A

B

C

D

E

A

B

C

D

E

DUAL PULSE METHOD OF WRITING AMORPHOUS MEMORY DEVICES

BACKGROUND OF THE INVENTION

The present invention relates generally to amorphous memory devices and more specifically to an improved method of setting amorphous memory devices.

Amorphous semiconductor memory devices, for example a tellurium base chalcogenide glass, are well known. These memory devices are generally bi-stable devices including the film of memory semiconductor material capable of being switched from a stable high resistance amorphous state into a stable low resistance crystalline state when a write or set voltage pulse of relatively long duration is applied. Such a set voltage pulse causes current to flow in a small filament. The resulting set or write current generally heats the region of the semiconductor material above its glass transition temperature into its crystallization temperature such that the material crystallizes around and in the region of the conducting filament. A crystallized low resistance filamentous path remains indefinitely even when the voltage and current are removed, until a reset or erase pulse is applied to return the filamentous path to its initial amorphous high resistance state.

A typical applied set voltage pulse $V_A$ is illustrated in FIG. 1 for a write. The resulting voltage across the device is illustrated in FIG. 2. Once the voltage across the device reaches the threshold voltage $V_{TH}$, the device switches from its high resistance state to a low resistance state. Upon reaching the low resistance state, the voltage levels off at substantially $V_H$ which is the holding voltage. As illustrated in FIG. 3, the current through the device begins to flow substantially after the device switches and continues until the voltage is removed.

The mechanisms involved in the material are illustrated in FIGS. 4, 5 and 6. As illustrated in FIGS. 4A and 5A, the voltage across the device creates a filamentous path in the center between the electrodes. Once the threshold voltage is exceeded, a complete filamentous path is established and the material switches as illustrated in FIGS. 4B and 5B. Since the device desires to maintain a constant current density, the filamentous path expands radially to accommodate the excess current. The temperature in the filamentous path is too high for the crystallization of the material. A given distance away from the hot filamentous path, the temperature is favorable for crystallization and an annular resistor forms about and separates from the hot filamentous path as illustrated in FIG. 4C. The resistor path starts stealing current from the hot filamentous path as illustrated in FIGS. 5C and 6C. Thus, the hot filamentous path starts shrinking since it does not have sufficient current to maintain the original radius of the hot filamentous path as illustrated in FIGS. 4D, 5D and 6D. Eventually, the hot filamentous path is extinguished and the annular resistor conducts all of the current as illustrated in FIGS. 4E, 5E and 6E. The resulting structure of FIG. 4E includes a primary filament represented by the circles and a secondary filament represented by the x's. The primary filament is the radius of the original hot filament and the second filament is the annulus crystalline area which encompasses the primary filament. It should be noted that FIG. 4 has an enlarged horizontal scale to emphasize the principle of operation.

In an erase cycle, not all of the crystallites are removed especially in the secondary filament. Thus, in subsequent write cycles the secondary filament will switch before the primary filament thus causing an expansion of the radius of the primary and secondary filament as illustrated in FIG. 7A. Eventually after a large number of set/reset cycles, the filament includes the total radius of the device with an amorphous material center as illustrated in FIG. 7B. This is the locked ON state and cannot be erased without totally destroying the material.

The applied voltage pulse of FIG. 1 is typically about 20 volts resulting in a write current of 6 to 15 milliamps. The pulse width is approximately 10 milliseconds with a one millisecond rise time and one millisecond fall time which are generally a function of the circuit parameters.

The problem with overdriving the filament using the voltage pulse of FIG. 1 is discussed in detail in United Kingdom Patent No. 1,372,414 published Oct. 30, 1974 to Marconi Company Limited. The solution provided by the Marconi patent is to apply a voltage pulse for a predetermined period at least sufficient to drive it into its conducting state but insufficient to render the conductive state permanent and also providing a second low level current pulse for maintaining the current flow through the device after it has been driven into the conductive state. These two pulses are illustrated in FIG. 8 wherein the first voltage pulse P1 is greater than the threshold voltage and may be as high as two times the threshold voltage. The second voltage pulse P2 is smaller than threshold voltage and produces a one milliamp holding current. The pulse width of the pulse P1 is 10 microseconds and the pulse width of P2 is 10 to 100 milliseconds. Since the duration of the first current pulse P1 is not sufficient to render the device permanently conductive, it is applied after the second pulse P2 has reached its desired value so as to maintain the filament in the conductive state for a sufficient time to be permanently conductive.

An important feature of the Marconi patent is that the set current is greater than the first critical value $I_1$ and less than a second critical current value $I_2$. The current $I_1$ is the minimum current to produce the crystallization temperature and $I_2$ is the current level to drive the material into the liquid phase which is conductive but results in the device returning to OFF state if the current is removed suddenly.

As illustrated in FIGS. 9A, 9B and 9C, the Marconi method of writing forms the same primary filament and secondary filament as the conventional write pulse of FIG. 1, but does not spread as quickly as the write pulse of FIG. 1. This results from the amount of time the device is driven with a large current created by the large voltage of P1 compared to the conventional pulse. Since the secondary filament is also present in Marconi, the primary filament area grows until it eventually fails in the totally ON state as illustrated in FIG. 9C.

Thus, there exists a need for a method of writing which assures that the successive switching always occurs in the same geometric channel.

SUMMARY OF THE INVENTION

An object of the present invention is to provide a method of writing amorphous materials such that successive switching always occurs in the same geometric channel.

Another object of the present invention is to provide a method of writing an amorphous memory device which has a substantially infinite life.

Still another object of the present invention is to provide a method for writing an amorphous memory device which is convenient to implement.

An even further object of the present invention is to eliminate the need for circuits required to generate rise and fall times for set pulses.

Still a further object of the present invention is to reduce the geometry of the required filament.

These and other objects of the present invention are attained by applying across an amorphous memory device a first voltage pulse of an amplitude initially sufficient to exceed the threshold voltage and to cause the device to switch and of a decreased amplitude across the device after switching to create a low amplitude holding current through the device of a sufficient duration to substantially crystallize the filamentous path. This may be achieved by applying a single amplitude voltage pulse across the device and a large series resistor to produce the initially high voltage and subsequently low current through the memory device. Immediately after the device has switched, a second voltage pulse is applied across the device of an amplitude sufficient to create a current through the device sufficient to drive the filamentous path into the liquid phase for a very short duration.

The first pulse has a duration or pulse width in the range of 5 to 10 milliseconds while in the second pulse has a duration or pulse width in the range of 0.05 to 1 microsecond. The first pulse has a holding current in the range of 1 to 5 milliamps and the second pulse has a current amplitude of approximately 30 milliamps. Large scale integration will further improve these parameters.

By using a changing amplitude voltage to switch and hold the device on, a minimum holding current and a predefined filamentous path are produced. By the use of a short duration high current pulse applied after switching, the total volume of the filamentous path is raised to a uniform temperature in the liquid phase so as to produce a uniform filamentous path without the formation of primary and secondary filaments.

Other objects, advantages and novel features of the present invention will become apparent from the following detailed description of the preferred embodiments when considered in conjunction with the accompanying drawings.

DESCRIPTION OF THE PREFERRED EMBODIMENTS

Figure 10:
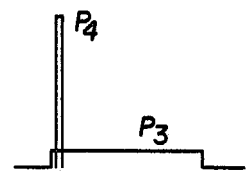
FIG. 10 is a graph of the applied voltage pulses incorporating the principles of the present invention.

The method of setting an amorphous memory device of the present invention includes two voltage pulses applied across the device. The first voltage pulse switches the device and maintains a minimum holding current and the second voltage pulse applied after the device switches creates a current sufficient to drive the filamentous path to the liquid phase and is terminated abruptly to homogenize the filamentous path structure. The first pulse P3 and the second pulse P4 are illustrated in FIG. 10. For sake of clarity and comparison P3 is depicted as the voltage across the device after switching.

Figure 1:
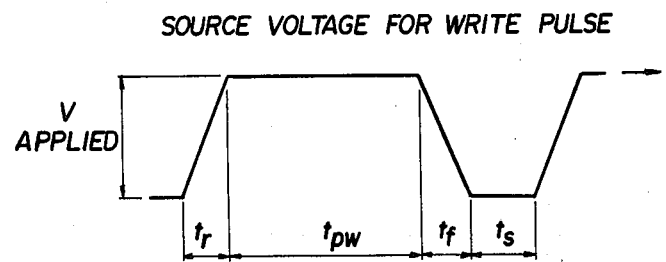
FIG. 1 is a graph of a prior art set voltage pulse.
Figure 2:
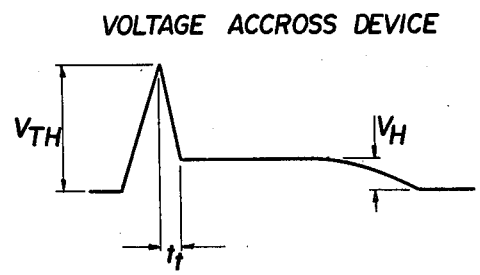
FIG. 2 is a graph of the voltage across a memory device resulting from the applied voltage pulse of FIG. 1.
Figure 3:
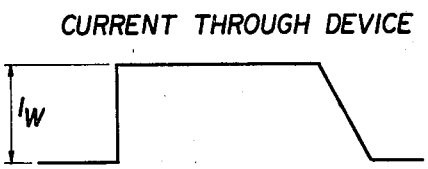
FIG. 3 is a graph of the current through device resulting from the applied voltage pulse of FIG. 1.
Figure 11:
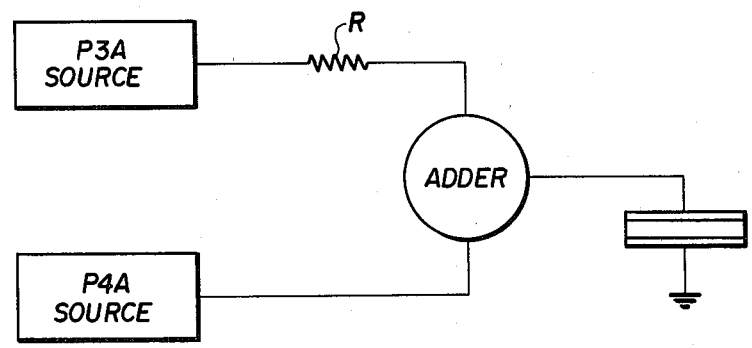
FIG. 11 is a block diagram of the circuit which will produce the pulses according to the principles of the present invention.
Figure 4:
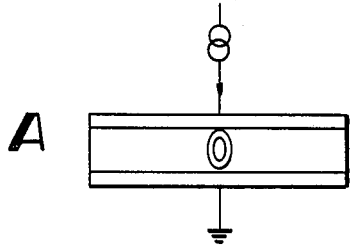
FIGS. 4A, B, C, D and E are cross-sectional views of an amorphous material memory device illustrating the progression of the set process using an applied voltage pulse of FIG. 1.
Figure 4:
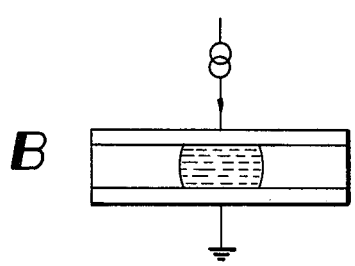
Figure 4:
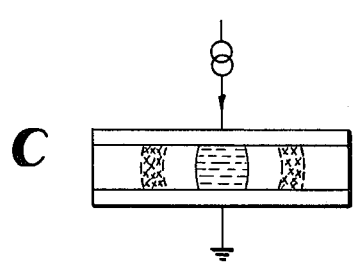
Figure 4:
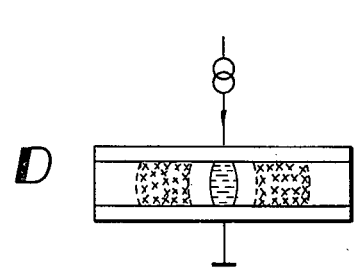
Figure 4:
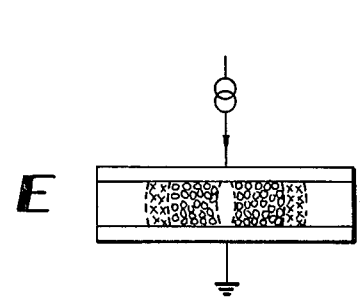
Figure 5:
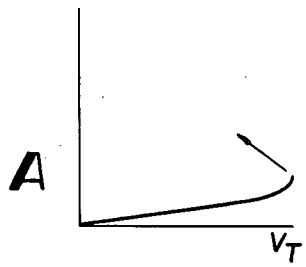
FIGS. 5A, B, C, D and E are graphs illustrating the relationship between voltage and current through the hot filamentous path corresponding to FIGS. 4A, B, C, D and E, respectively.
Figure 5:
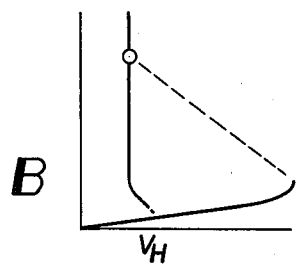
Figure 5:
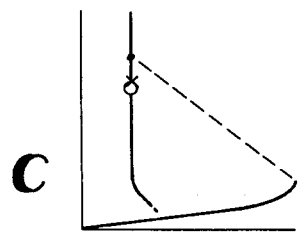
Figure 5:
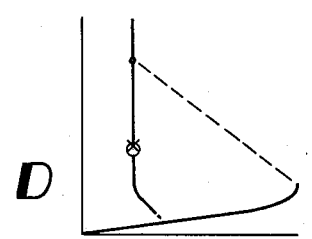
Figure 5:
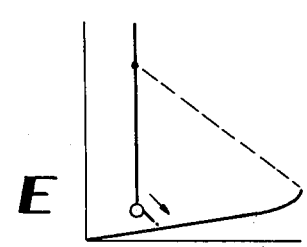
Figure 6:
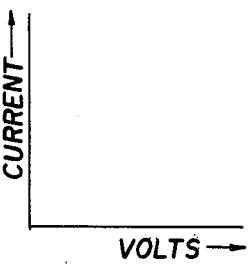
FIGS. 6A, B, C, D and E are graphs illustrating the voltage and current through the annular resistor formed and corresponding to FIGS. 4A, B, C, D and E.
Figure 6:
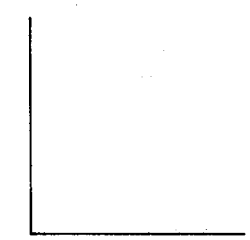
Figure 6:
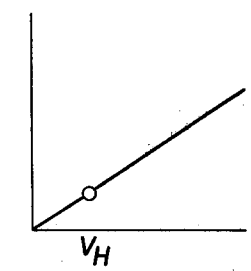
Figure 6:
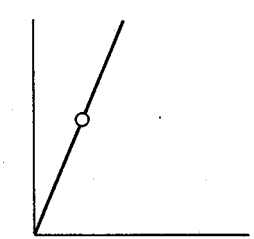
Figure 6:
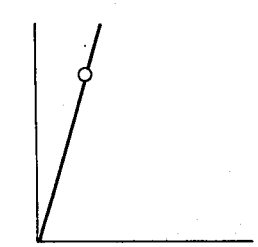
Figure 8:
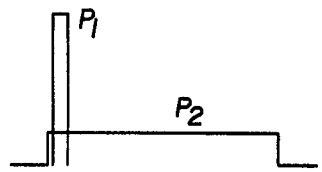
FIG. 8 is a graph of the applied voltage pulses of the Marconi patent.

The first voltage pulse P3 is a large voltage pulse applied to the device through a series resistance R by a pulse source (P3A Source), as illustrated in FIG. 11. The applied voltage P3A has a sufficient amplitude to create a voltage across the device greater than the threshold voltage. For example, if the device has a threshold of 15 volts and a high resistance value of 1 megohm, the P3A or applied voltage source for P3 may be for example 20 volts, and a series resistor R may be for example 20 kohms. Approximately all of the applied voltage P3A, namely 20 volts will appear across the amorphous memory device. Since this exceeds the threshold value of 15 volts, the device will switch from its high resistance state to its low resistance state. In the low resistance state, having a resistance value of approximately a hundred ohms, a majority of the voltage will appear across the series resistor R. The resulting current will be in the 1 to 5 milliamp range.

The source for the P4 pulse (P4A Source) applies a P4A pulse not through a resistor such that the total voltage will appear across the device. The importance of the P4A Source is that it provides a high current for a very short period of time. For example, the P4A Source may be a 3 volt pulse producing a current of 30 milliamps. An adder is shown connecting the P3A and P4A voltage sources to the amorphous memory device. The voltage sources for P3A and P4A are selected to have a rise and fall time in the 10 nanosecond range. Since the rise time of the voltage sources and the response of the device is in the nanosecond range, the application of the P4 to the amorphous device is delayed, for example 15 nanoseconds relative to the application of P3. This will assure that the amorphous device has switched from its high to its low resistance state before the application of the P4 voltage pulse, since the amplitude of P4 is below the threshold voltage and would have little effect before switching.

Figure 12A:
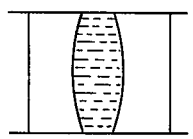
FIGS. 12A, B, C and D are cross-sectional views of an amorphous memory device at different stages using the write pulse of FIG. 10.
Figure 12B:
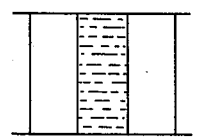

The operation of the application of P3 and P4 to the semiconductor device is illustrated in FIGS. 12A, B, C and D. Once the device has switched in response to P3, a hot filamentous path is established between the electrodes as illustrated in FIG. 12A. Immediately after switching, the high current produced by the voltage pulse P4 drives the hot filamentous path into the liquid phase as illustrated in FIG. 12B. To accommodate the large influx of current, the filamentous path radially expands as indicated in the difference of the radius of FIGS. 12A and 12B. The width of pulse P4 is selected to be sufficiently short and of sufficiently high amplitude such that the filamentous path cannot thermally expand fast enough to accommodate all the additional current and therefore must be driven into the liquid phase. Since P4 is selected to be extremely short in duration or width, the filamentous path does not extend greatly and the annulus resistor of crystalline material does not have a chance to form.

Figure 12C:
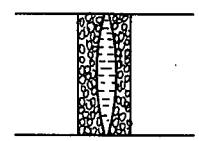
Figure 12D:
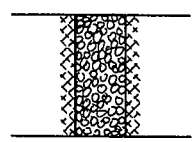
Figure 7A:
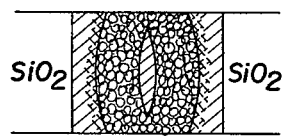
FIGS. 7A and 7B are cross-sectional views of an amorphous memory device after 1000 cycles and greater than 1,000,000 cycles, respectively, using the applied voltage pulse of FIG. 1.
Figure 9A:
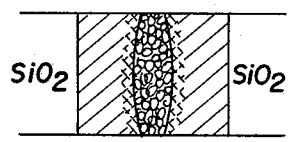
FIGS. 9A, B and C are cross-sectional views of an amorphous memory device after 1 set cycle, 1,000 set cycles and over a 1,000,000, respectively, set cycles using the applied current pulses of FIG. 8.

Upon the cessation of pulse P4, the hot filamentous section collapses to a very narrow section surrounded by an annulus of crystalline material being held by the holding current above the crystalline temperature point. This is illustrated in FIG. 12C. As in the other models, the annulus crystalline resistor hoggs the current extinguishing the hot filamentous path and the resulting filamentous path is completely crystallized. Because of the abrupt collapse of the high current resulting from voltage pulse P4, a very narrow secondary filament is formed about the primary filament as illustrated in FIG. 12D. It should be noted that the secondary filament in FIG. 12D is within the radius produced in the hot liquid phase filament of FIG. 12B. During subsequent setting sequences, the total filament area including the secondary filament are driven to their glass transition temperature. Thus, there is no residual secondary filament that hoggs current from the primary filament area in the initial stage after switching and that produces a failed state after, for example a million cycles as in prior art devices. It should be noted that FIGS. 12A-12D are enlarged to illustrate the set process, and FIGS. 13A and 13B should be referred to for comparison to prior art methods.

Figure 13A:
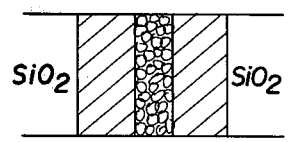
FIGS. 13A and B are cross-sectional views of an amorphous memory device using the applied pulses of FIG. 10 after 1000 cycles of being set and over a 1,000,000 cycles being set, respectively.
Figure 7B:
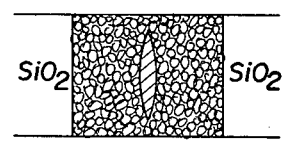
Figure 9B:
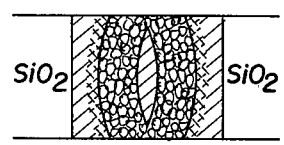
Figure 13B:
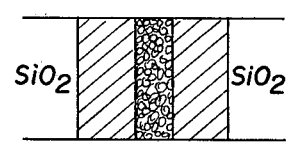
Figure 9C:
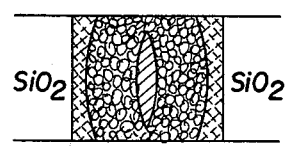

While the high current pulse P4 has relatively narrow width in the range of 0.1 microseconds to 1 microseconds, the low current producing pulse P3 has a longer duration in the range of 6 to 10 milliseconds. It should be noted that the longer pulse P3 should have a duration sufficiently long to allow the total filamentous path to crystallize. The present write method uses a high amplitude voltage pulse sufficient to switch the amorphous device from the high resistance to the low resistance state and results in a subsequent low current through the device. This minimizes the radius of the filament and the chances of overdrive. The second voltage pulse is applied directly to the memory device after it has switched and thus can be of extremely low voltage. This will produce a short duration high current pulse through the device which will drive the entire filamentous path into the liquid phase. Upon termination of this short duration high current pulse, the holding current from the long duration pulse maintains the temperature of the filamentous path substantially at the crystallization temperature of the material. This allows the filamentous path to uniformly crystalline without the growth of a large annulus resistor and the resulting secondary filament. As illustrated in FIGS. 13A and 13B, the radius of the filament remains constant over a substantial number of cycles.

From the preceding description of the invention, it is evident that the objects are attained in that a new write method is provided which does not cause the device to fail in the completely ON state. Although the invention has been described and illustrated in detail, it is clearly understood that the same is by way of illustration and example only and is not to be taken by way of limitation. The spirit and scope of the present invention are to be limited only by the terms of the appended claims.

What is claimed:

1. A method of setting a filament-type memory device including spaced electrodes between which extends a body of high resistance generally amorphous material, a filamentous path of which switches to a low resistance generally crystalline state when a voltage pulse in excess of a given threshold voltage value is applied to said electrodes, the method comprising:
   applying to said electrodes and a series high resistance a first voltage pulse of a first amplitude and first duration, said first amplitude and said series resistance being sufficient to create across said electrodes a voltage exceeding the threshold voltage of the device prior to switching and to create a holding current through said device after switching, said first duration being sufficient to set said device; and
   applying a second voltage pulse of a second amplitude and second duration across said electrodes immediately after said device has switched, said second voltage amplitude being substantially less than said first voltage amplitude, and said second duration being substantially less than said first duration to create a current spike through said device of a substantially greater amplitude than said holding current.

2. The method according to claim 1 wherein said second duration is in the range of 0.05 to 1 microsecond.

3. The method according to claim 2 wherein said first duration is in the range of 5 to 10 milliseconds.

4. The method according to claim 1 wherein said voltage amplitude is selected to create a current amplitude sufficient to drive said filamentous path into the liquid phase.

5. A method of setting a filament-type memory device including spaced electrodes between which extends a body of high resistance generally amorphous material, a filamentous path of which switches to a low resistance generally crystalline state when a voltage pulse in excess of a given threshold voltage is applied across the electrodes, the method comprising:
   applying to said electrodes a first voltage pulse of an amplitude initially sufficient to create across said device a voltage the threshold voltage of the device to switch said device and after switching to create a low amplitude holding current through said device, said first pulse having a first duration sufficient to substantially crystallize said filamentous path; and
   applying a second voltage pulse to said electrodes immediately after said device has switched of an amplitude sufficient to create a current through said device sufficient to drive said filamentous path into the liquid phase for a very short duration.

6. The method according to claim 5 wherein the duration of said second pulse is sufficiently short to define a liquid phase filamentous path with a minimum of radial expansion.

7. The method according to claim 5 wherein the duration of said second pulse is in the range of 0.05 to 1 microsecond.

8. The method according to claim 5 wherein the duration of said first pulse is in the range of 5 to 10 milliseconds.

9. The method according to claim 5 wherein said first pulse is applied to a series combination of a resistance and said device, said resistance has a value sufficient to create a voltage across said device greater than said threshold voltage before switching of said device while minimizing the holding current after switching of said device.

10. The method according to claim 5 wherein said second pulse is identical to the pulse used to reset the filamentous path.

* * * * *

UNITED STATES PATENT AND TRADEMARK OFFICE
CERTIFICATE OF CORRECTION

PATENT NO. : 4,389,713
DATED : June 21, 1983
INVENTOR(S) : Patel et al.

It is certified that error appears in the above—identified patent and that said Letters Patent is hereby corrected as shown below:

Col. 2, line 19, after "Patent" insert --Specification--.

Col. 6, line 60, after "voltage" (1st occurrence) insert --above--.

Signed and Sealed this

Fourth Day of October 1983

[SEAL]

Attest:

GERALD J. MOSSINGHOFF

Attesting Officer   Commissioner of Patents and Trademarks